United States Patent [19]

Reavill et al.

[11] 4,290,838

[45] Sep. 22, 1981

[54] METHOD FOR VACUUM LAMINATION OF FLEX CIRCUITS

[75] Inventors: Joseph A. Reavill, Mira Loma; John M. Arachi, Riverside, both of Calif.

[73] Assignee: General Dynamics, Pomona Division, Pomona, Calif.

[21] Appl. No.: 67,254

[22] Filed: Aug. 17, 1979

Related U.S. Application Data

[62] Division of Ser. No. 965,976, Dec. 4, 1978, Pat. No. 4,234,373.

[51] Int. Cl.$^3$ .................. B29C 17/00; B32B 31/00
[52] U.S. Cl. .................. 156/286; 156/289; 156/306.6; 156/312; 156/902
[58] Field of Search .............. 156/87, 285, 286, 312, 156/313, 288, 289, 320, 321, 382, 634, 902, 306.6

[56] References Cited

U.S. PATENT DOCUMENTS

| 3,573,126 | 3/1971 | Kougel | 156/286 X |
| 3,681,171 | 8/1972 | Hojo et al. | 156/286 X |
| 3,684,610 | 8/1972 | Frielingsdorf et al. | 156/285 X |
| 3,960,635 | 6/1976 | La Roy et al. | 156/286 |

OTHER PUBLICATIONS

IBM Technical Disclosure Bulletin, Thin Foil Laminator by R. F. Penoyer, vol. 9, No. 10, Mar. 1967, p. 1411.

Primary Examiner—William A. Powell
Attorney, Agent, or Firm—Neil F. Martin; Freling E. Baker; Edward B. Johnson

[57] ABSTRACT

A vacuum laminating fixture includes a pair of opposed plates having opposed plane faces with a peripheral groove formed in each plate surrounding the face with the grooves matched for receiving a unitary band seal extending between the grooves for sealing the space between the faces of the plates, a vacuum port is formed in the lower plate communicating with the area of the face inside the peripheral groove. The method includes setting up a laminate of plural flexible sheets of circuit, placing the laminate within and between the faces of the plates, drawing a vacuum of 28 inches of mercury for a period of two minutes to completely evacuate the space between the laminate sheets, and thereafter applying a predetermined curing pressure and temperature to the plates within a press.

5 Claims, 8 Drawing Figures

APPLY VACUUM TO EVACUATE AIR FROM LAMINATIONS.

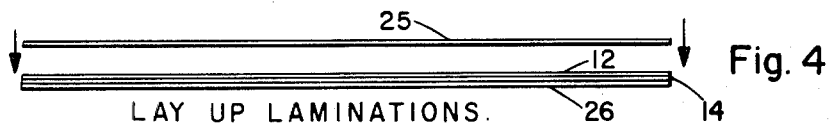
Fig. 4 LAY UP LAMINATIONS.
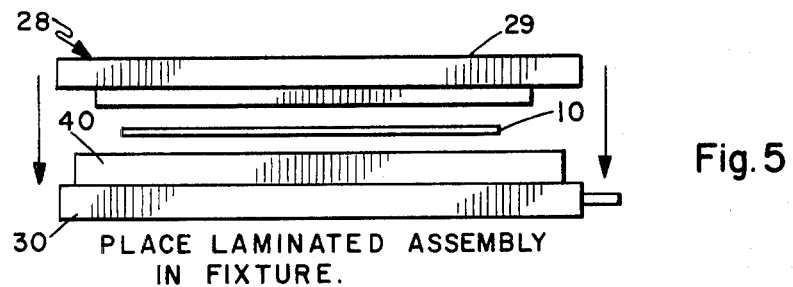
Fig. 5 PLACE LAMINATED ASSEMBLY IN FIXTURE.
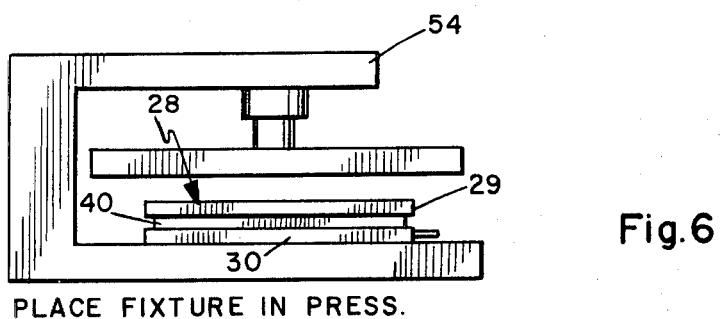
Fig. 6 PLACE FIXTURE IN PRESS.
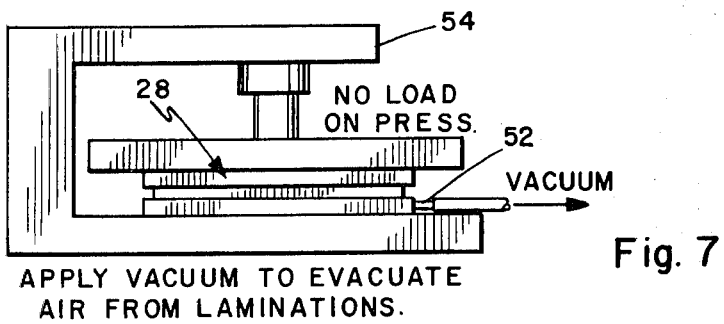
Fig. 7 APPLY VACUUM TO EVACUATE AIR FROM LAMINATIONS.
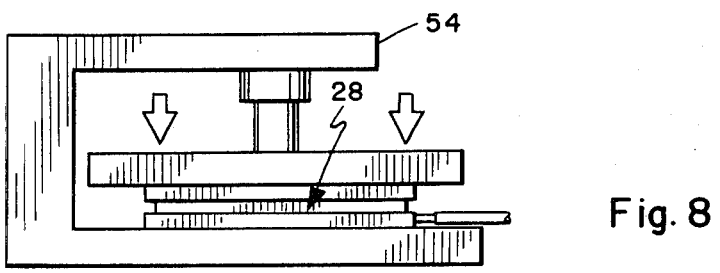
Fig. 8 PRESS AND CURE LAMINATED ASSEMBLY. REMOVE FINISHED PART FROM FIXTURE.

METHOD FOR VACUUM LAMINATION OF FLEX CIRCUITS

This is a division, of application Ser. No. 965,976 filed Dec. 4, 1978, U.S. Pat. No. 4,234,373.

BACKGROUND OF THE INVENTION

The present invention relates to laminated wiring cables, and pertains particularly to a method and apparatus for lamination of flex cable circuits.

Multi-layer printed wiring cables are manufactured by a laminating process wherein multiple printed circuits, each of which is formed by a flexible carrier provided with a conductor pattern formed on at least one side thereof, are laminated together. The layers are usually secured together by an adhesive which is cured by process of applying temperature and pressure. During this process of lamination, air within the space between the platens between which the layers are pressed is frequently evacuated.

While the prior art techniques have been found to be suitable in situations where highly fluid adhesives are used, such techniques are unsuitable where very low flow, or no flow, adhesives are used. These prior art techniques have resulted in inadequate evacuation of the air from the chamber with the result that air is trapped between the laminations.

It has also been found that prior art fixtures have a number of drawbacks. Such drawbacks include the complicated structures which greatly increase the production time in the processing. The prior art fixture structures for such techniques typically employ a barrel structure having a side wall with end plates sealed to or sealably engaging the side walls and the vacuum connection to the interior of the barrel being through the side wall. This presents difficulties in sealing the structure for drawing an adequate vacuum. Other forms of vacuum laminating structures of fixtures involving the use of vacuum also have sealing difficulties which complicates the manufacturing process.

The prior art approach to wiring cable laminations is exemplified, for example, in U.S. Pat. No. 3,960,635, issued June 1, 1976 to Laeroy et al. This patent is directed to a method of fabrication of printed circuits and schematically illustrates a fixture for carrying out the process. This patent discloses the typical barrel fixture technique. The patent also fails to appreciate or recognize the necessity for complete evacuation of the fixture prior to application of laminating pressure.

Other patents of somewhat general interest includes the Willett patent, U.S. Pat. No. 3,444,275, issued May 13, 1969, and directed to a method of molding utilizing dielectric heating. The fixture utilizes separate walled chambers defined by annular walls 24 which surround plates 22 and 23 and through which the vacuum conduits extend.

It is desirable that improved method and apparatus be available for the formation of laminated multi-layer printed wiring cables.

SUMMARY AND OBJECTS OF THE INVENTION

It is the primary object of the present invention to overcome the above problems of the prior art.

Another object of the present invention is to provide an improved method of laminating multi-layer printed wiring cables.

A further object of the present invention is to provide an improved apparatus for the manufacture of multi-layer printed wiring cables.

In accordance with the primary aspect of the present invention, a laminating fixture includes upper and lower opposed facing plates, each having a peripheral groove in which a unitary seal extends for sealingly enclosing a chamber between the plates with vacuum port communicating with the interior of the space by way of one of the vacuum plates.

BRIEF DESCRIPTION OF THE DRAWINGS

The above and other objects and advantages of the present invention will become apparent from the following description when read in conjunction with the drawings, wherein:

FIGS. 4 through 8 illustrate the steps of the method of laminating the multi-layer element.

DETAILED DESCRIPTION OF A PREFERRED EMBODIMENT

Figure 1:
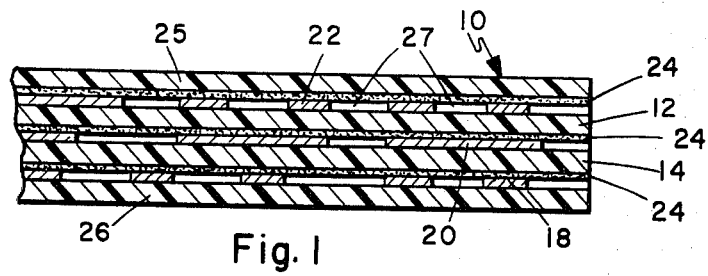
FIG. 1 is a sectional view of a typical laminated printed circuit assembly.

Turning to FIG. 1 of the drawing, a laminate of printed wiring cables is illustrated and designated generally by the numeral 10. The cable consists of a plurality of layers of printed circuits 12 and 14, each with metal circuit elements 18, 20 and 22 such as copper on thin flexible backing such as Kapton. Either one or both of the circuits may be double clad Kapton. Layers 24 of adhesive are disposed between each layer and a top and bottom covering layer 25 and 26. Void spaces 27 exist between the metal conductor elements on each board. The adhesive is preferably a low or no-flow adhesive, typically a dry film adhesive such as Acrylic. Such adhesives are desirable, but because of the low or no flow characteristics are unable to assist in expulsion of trapped air between the layers when pressure is applied thereto.

It has been found to be essential that a very high vacuum be applied to the laminate on the order of 28 inches of mercury for a predetermined minimum period of time, such as approximately 2 minutes, in order to insure the evacuation of air and the like from the spaces between the layers of the laminate.

Figure 2:
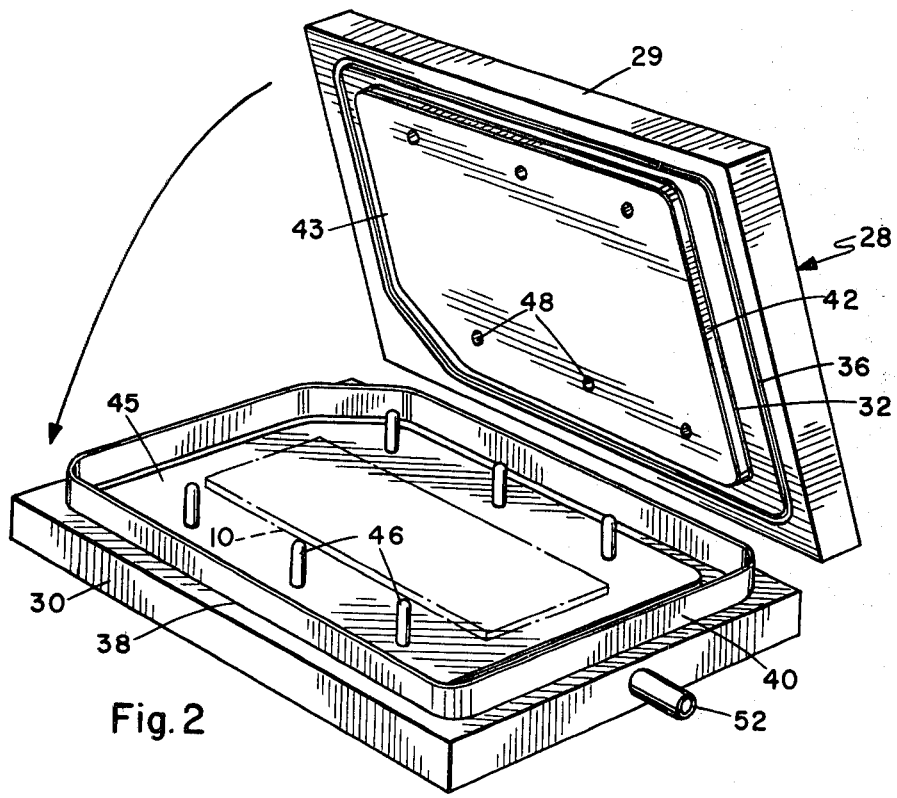
FIG. 2 is a perspective view of the laminating fixture in the open position.

Turning to FIG. 2, a simple, inexpensive and extremely effective laminating fixture 28 is illustrated. This fixture 28 comprises an upper plate 29 and an opposing lower plate 30, which have opposing planar faces which are covered by a series of liners and pads. A pair of liners 32 and 34 of stainless steel, the primary function of which is to accommodate differential thermal expansion between the aluminum plates and the printed circuit boards. These plates or liners may be termed expansion plates or liners, since they take up the difference in expansion. The pressure pads 42 and 44 are preferably silicon rubber on the order of 0.062 in thickness and preferably reinforced with fiberglass. Release sheets 43 and 45, preferably of 1 mil Teflon, are placed over the faces of each pad.

Figure 3:
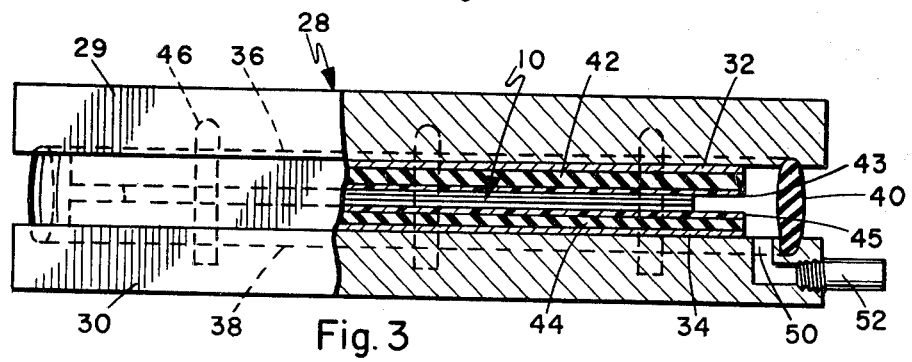
FIG. 3 is a side elevational view, partially cut away, of the closed fixture with a laminated assembly in place.

Peripheral grooves 36 and 38 are formed in the respective plates for receiving a unitary seal member 40 of a generally flat wide band configuration. This band seal, as best seen in FIG. 3, has a narrow width to height, such that it extends between the upper and lower plates of the fixture within the grooves and supports the upper plate with sufficient clearance to permit the placement of a pair of pressure pads 42 and 44, and the laminate 10 with a slight clearance. This clearance permits the vacuum to more readily draw all air from the spaces between the layers of the laminate before the application of heat and pressure. The seal member is preferably slightly thicker in the center to further enhance the sealing when biased into the grooves 36 and 38. The upper groove 36 is preferably slightly shallower than the lower groove 38 so that the seal member will remain in the lower groove when the press fixture is opened.

A plurality of guide pins 46 cooperate with a plurality of bores 48 in the upper plate to provide alignment between the upper and lower plates. The seal in cooperation with the plates provides a chamber within the perimeter of the seal and between the faces of the plates in which the pressure pads and the laminate are disposed. Evacuation of this chamber is achieved by means of a vacuum port 50 having suitable conduit connecting means 52 for connecting to a source of vacuum for evacuating the chamber. This arrangement provides a fairly simple, inexpensive and effective vacuum laminating fixture, which is highly effective to provide a vacuum seal which permits relatively high vacuums to be drawn and permits fairly rapid production techniques. The seal is preferably a silicon rubber.

The essential steps of the invention are best ilustrated in FIGS. 4 through 8. The steps consist or comprise primarily the initial step of laying up the laminations by selecting and laying up a plurality of printed circuit boards of the desired configuration in the desired arrangement, selecting and placing an appropriate adhesive between the adjacent layers of the lamination. After the lamination has been layed up, it is placed within a fixture 28, as previously described, consisting of opposed plates having opposed faces with pressure pads, expansion liners, and release sheets and a peripheral band seal extending in a peripheral groove in the respective plates. Once the lamination is placed within the fixture and the fixture closed, a high vacuum is drawn on the fixture on the order of 28 inches of mercury for approximately 2 minutes. This vacuum is drawn while the seal holds the weight of the upper plate off the lamination. The fixture may then be placed in a press 54, if not previously done so, and a pressure applied to the fixture forcing the opposed plates toward one another and applying a pressure of between 400 and 900 psi and a temperature of between 340° and 400° F. to achieve curing of the adhesive. After appropriate curing, the laminate is removed from the assembly and finished in the desired manner.

While the present invention has been illustrated and described by means of a particular embodiment, it is to be understood that numerous changes and modifications may be made therein without departing from the spirit and scope of the invention as defined in the appended claims.

Having described our invention, we now claim:

1. A method of laminating printed circuits comprising:
   selecting a sealable press fixture having opposed plates defining upper and lower planar faces and including a peripheral band seal extending between the plates;
   forming a laminate of flexible sheets of circuits with an adhesive between said sheets;
   placing the laminate of circuits between said plates in said fixture for engagement thereby;
   closing said fixture;
   applying a vacuum in the fixture for drawing air from between said sheets of circuit while supporting the face of said upper plate out of engagement with said laminate;
   maintaining the vacuum for predetermined period of time; and
   applying pressure to the press fixture for forcing the laminate to bond together.

2. The method of claim 1 including the step of selecting a high viscosity glue.

3. The method of claim 1, wherein said adhesive is selected to have no flow.

4. The method of claim 3, wherein said adhesive is a dry film adhesive.

5. The method of claim 4, wherein said adhesive is an acrylic.

* * * * *